(12) United States Patent
Casady et al.

(10) Patent No.: US 6,410,396 B1
(45) Date of Patent: Jun. 25, 2002

(54) SILICON CARBIDE: GERMANIUM (SIC:GE) HETEROJUNCTION BIPOLAR TRANSISTOR; A NEW SEMICONDUCTOR TRANSISTOR FOR HIGH-SPEED, HIGH-POWER APPLICATIONS

(75) Inventors: Jeffrey B. Casady; Michael S. Mazzola; Stephen E. Saddow, all of Starkville, MS (US)

(73) Assignee: Mississippi State University, Mississippi State, MS (US)

( * ) Notice: Subject to any disclaimer, the term of this patent is extended or adjusted under 35 U.S.C. 154(b) by 0 days.

(21) Appl. No.: 09/825,065

(22) Filed: Apr. 4, 2001

Related U.S. Application Data
(60) Provisional application No. 60/199,822, filed on Apr. 26, 2000.

(51) Int. Cl.[7] .............................................. H01L 21/331
(52) U.S. Cl. ...................... 438/312; 438/931; 438/602; 257/197; 257/198
(58) Field of Search .......................... 438/312, 94, 520, 438/514, 602, 607, 931, 565, 530; 257/197, 198, 613, 51, 183, 76–78, 96

(56) References Cited

U.S. PATENT DOCUMENTS

| | | | |
|---|---|---|---|
| 5,225,371 A | * 7/1993 | Sexton et al. | ............... 438/535 |
| 5,360,986 A | * 11/1994 | Candelaria | ................... 257/183 |
| 5,557,118 A | 9/1996 | Hashimoto | |

OTHER PUBLICATIONS

C.H.H. Emons, R. Koster, D. Paxman, and M.J.J. Theunissen, "Comparison of Polysilicon and Silicon–Carbon Emitters with Enhanced Emitter Efficiency," Proc. Of IEEE Bipolar/BiCMOS Circuits & Technology Meeting (BCTM), p. 72–75, Dec. 1994.

T. Sugii, T. Yamazaki, and T. Ito, "Si Hetero–Bipolar Transistor with a Fluorine–Doped SiC Emiter and a Thin, Highly Doped Epitaxial Base," IEEE Trans. Elect. Dev., vol. 37, No. 11, p. 2331–2335, Nov. 1990.

Z.A. Shafi, I.R.C. Post, J. Whitehurst, P. Wensley, P. Ashburn, P.B. Moynagh, and G.R. Booker, "Poly–crystalline Silicon–Carbide (SiCarb) Emitter Bipolar Transistors", Proc. Of IEEE Bipolar/BiCMOS Circuits & Technology Meeting (BCTM) p. 67–70, 1991.

G. Gao, J. Sterner, and H. Morkoc, "High Frequency Performance of SiC Heterojunction Bipolar Transistors", IEEE Trans. On Electron Devices, vol. 41, No. 7, pp. 1092–1097, Jul. 1994.

S.S. Chang, J. Pankove, M. Leksono, and B. VanZeghbroeck, "500° C Operation of GaN/SiC Heterojunction Bipolar Transistor," 53rd Dev. Research Conf. Digest, p. 106–107, Jun. 19–21, 1995.

* cited by examiner

*Primary Examiner*—Olik Chaudhuri
*Assistant Examiner*—Yennhu B. Huynh
(74) *Attorney, Agent, or Firm*—Piper Rudnick LLP; Steven B. Kelber

(57) ABSTRACT

Devices and methods for fabricating wholly silicon carbide heterojunction bipolar transistors (HBTs) using germanium base doping to produce suitable emitter/base heterojunctions. In one variation, all device layers are are grown epitaxially and the heterojunction is created by introducing a pseudoalloying material, such as germanium, to form a graded implant. In other variations, the device epitaxial layers are 1) grown directly onto a semi-insulating substrate, 2) the semi-insulating epitaxial layer is grown onto a conducting substrate; 3) the subcollector is grown on a lightly doped p-type epitaxial layer grown on a conducting substrate; and 4) the subcollector is grown directly on a conducting substrate. Another variation comprises a multifinger HBT with bridging conductor connections among emitter fingers. Yet another variation includes growth of layers using dopants other than nitrogen or aluminum. Yet another variation includes implantation of region within one or more epitaxial layers, rather than use of separate epitaxial layers.

27 Claims, 8 Drawing Sheets

US 6,410,396 B1

SILICON CARBIDE: GERMANIUM (SIC:GE) HETEROJUNCTION BIPOLAR TRANSISTOR; A NEW SEMICONDUCTOR TRANSISTOR FOR HIGH-SPEED, HIGH-POWER APPLICATIONS

This application claims priority from U.S. Provisional Application Ser. No. 60/199,822 filed Apr. 26, 2000. The entirety of that provisional application is incorporated herein by reference.

BACKGROUND OF THE INVENTION

1. Field of the Invention

The present invention relates to devices and methods for fabricating integrated circuits, and in particular to devices and methods for fabricating heterojunction bipolar transistors wholly from silicon carbide and using germanium doping to produce suitable emitter/base heterojunctions.

2. Background of the Technology

High-efficiency power amplifiers (PA) operating from the VHF (0.1 GHz) to above X-band ((>10 GHz) are critical components for next-generation military and civilian applications. Bipolar transistor topologies are often preferred over Field Effect Transistors (FETs) for many of those PA applications because of their excellent linearity and large gain at high frequencies, as well as a small noise figure, which is minimized at very low currents. Generally, bipolar transistors are electronic devices with two pn junctions in close proximity.

Power amplifier design in the best of circumstances is a challenging venture, but at high radio frequency (RF) and microwave frequencies and at high power densities, this is particularly true. Conventional silicon (Si) bipolar junction transistors (BJTs) cannot deliver adequate linearity, noise figure, and gain with useful breakdown voltage at such high frequencies. Heterojunction bipolar transistors (HBTs) are bipolar transistors having emitter materials with band gaps larger than that of the material used in the base. Heterojunction bipolar transistors comprised of III–V (i.e., gallium arsenide (GaAs)) have a number of benefits over Si based HBTs in this context, but the poor thermal properties of most conventional III–V materials is an undesirable feature.

Wide bandgap materials such as gallium nitride (GaN) have recently received significant attention for high frequency applications, but fundamental issues associated with substrate growth, doping, device processing, and long-term device reliability may limit their ultimate practicality. For example, aluminum gallium nitride/gallium nitride (AlGaN/GaN) HBT's have been demonstrated, but suffer from many fundamental problems (e.g., $h_{fe}$ of 1.5, RIE type conversion of the base, large sheet resistance of the Mg-doped base, very poor minority carrier lifetimes in the nanosecond (ns) range). Silicon carbide, on the other hand, is a rapidly maturing semiconductor technology that has excellent thermal conductivity, high breakdown strength, and a semi-insulating (SI) substrate. An approach used to obtain better thermal dissipation in the III–V nitride devices has been to use SiC as the substrate for growth; a related approach takes advantage of the bandgap difference between AlGaN and SiC to form the AlGaN/SiC HBT, which uses SiC for the collector and base. However, using SiC substrates has not solved one of the most fundamental problems associated with nitride devices, which are the excessive defect densities present in the active devices. The defects are believed to cause (although the mechanism is not well understood) the poor reliability and scale-up of devices demonstrated to date. Current slump, proportional to the value of $f_t$, has been observed in AlGaN/GaN devices, and scaling up to the total powers obtained by SiC devices has not been achieved.

Some attention has been given to realizing all SiC HBT's by using different polytypes (e.g., 3C on 6H); however, there remains a need to solve the problem of difficult and impractical multiple polytype growth.

Hashimoto in U.S. Pat. No. 5,557,118 reveals an HBT in which the base is a silicon germanium (SiGe) alloy and the emitter is SiC. To avoid the intolerably large lattice mismatch between SiGe and SiC, the patent to Hashimoto reveals a graded alloy of silicon, carbon, and germanium that supposedly grades the lattice constant from the stochiometric value for SiC to the stochiometric value for the SiGe alloy used. However, it is doubtful that such an alloy is feasible, given that useful crystals with carbon content above about 8% in SiGe are difficult to grow, and even this can only be described as a "pseudoalloy," as SiC does not alloy with a stochimoetry different than 50%.

SUMMARY OF THE INVENTION

The present invention includes devices and methods for fabricating all silicon carbide heterojunction bipolar transistors (HBTs) using germanium base doping to produce suitable emitter/base heterojunctions. The present invention uses a stochiometric SiC crystal throughout; the heterojuncton is formed by doping the base heavily (a few percent) with germanium (SiC:Ge), which produces a valence band offset of several hundred meV with respect to SiC. Although not as large as the valance band offset between SiC and SiGe, the offset provided by the present invention is still adequate for good HBT design. Further, the lattice mismatch is much lower (less than 1%) between SiC:Ge SiC than between SiGe and SiC, as disclosed in the prior art, providing a mismatch in the present invention that is quite tolerable.

In one embodiment of the present invention, all device layers are are grown epitaxially and the heterojunction is created by introducing a pseudoalloying material, such as germanium, with SiC, to form a graded implant. In a second embodiment, device epitaxial layers are grown directly onto a semi-insulating substrate. In a third embodiment, the semi-insulating epitaxial layer is grown onto a conducting substrate. In a fourth embodiment, the subcollector is grown on a lightly doped p-type epitaxial layer grown on a conducting substrate. In a fifth embodiment, the subcollector is grown directly on a conducting substrate.

Another embodiment of the present invention comprises a multi-finger HBT with bridging conductor connections among emitter fingers. Yet another embodiment includes growth of layers using dopants other than nitrogen or aluminum. Yet another embodiment includes use of an implantation region within one or more epitaxial layers, rather than use of separate epitaxial layers.

To achieve the stated and other advantages of the present invention, as embodied and described below, the invention includes a method for making integrated circuits having at least one heterojunction bipolar transistor, comprising: forming a semi-insulating boron-doped silicon carbide layer on a silicon carbide substrate, the semi-insulating boron-doped silicon carbide layer having a surface; forming a degeneratively doped n-type subcollector layer on the surface of the semi-insulating boron-doped silicon carbide layer; forming a doped n-type collector layer on the subcollector layer, wherein the collector layer has less doping than the subcollector layer, wherein the collector layer has a surface; forming a degeneratively doped p-type base layer on the surface of the collector layer, the base layer having a surface; and forming a doped n-type emitter layer on the surface of the base layer, the emitter layer having greater doping than the collector layer; wherein a pseudoalloying material is introduced at varying concentrations in the base layer and in the collector layer, the concentration varying from a greater concentration in the base layer to a lesser concentration in the collector layer, such that a graded junction is formed.

To achieve the stated and other advantages of the present invention, as embodied and described below, the invention further includes a method for making integrated circuits having at least one heterojunction bipolar transistor, comprising: forming a degeneratively doped n-type subcollector layer on a substrate; forming a doped n-type collector layer on the subcollector layer, wherein the collector layer has less doping than the subcollector layer, wherein the collector layer has a surface; forming a degeneratively doped p-type base layer on the surface of the collector layer, the base layer having a surface; and forming a doped n-type emitter layer on the surface of the base layer, the emitter layer having greater doping than the collector layer; wherein a pseudoalloying material is introduced at varying concentrations in the base layer and in the collector layer, the concentration varying from a greater concentration in the base layer to a lesser concentration in the collector layer, such that a graded junction is formed.

To achieve the stated and other advantages of the present invention, as embodied and described below, the invention further includes a method for making integrated circuits having at least one heterojunction bipolar transistor, comprising: forming a degeneratively doped n-type subcollector layer on the surface of a substrate, wherein the subcollector layer has a surface and at least one edge, and wherein the subcollector is bounded on at least one edge by an insulator, the insulator having a surface; forming at least one doped n-type collector layer on the subcollector layer, wherein each of the at least one collector layer has less doping than the subcollector layer, wherein the collector layer has a surface; forming a degeneratively doped p-type base layer on the surface of each of the at least one collector layer, such that at least one base layer is formed, each of the at least one base layer having a surface; forming a doped n-type emitter layer on the surface of each of the at least one base layer, such that at least one emitter layer is formed, each of the at least one emitter layer having greater doping than each of the at least one collector layer, and wherein each of the at least one emitter layer has a surface; and forming at least one conducting bridge between the surface of at least one of the at least one emitter layer and the surface of the insulator; wherein a pseudoalloying material is introduced at varying concentrations in the base layer and in the collector layer, the concentration varying from a greater concentration in the base layer to a lesser concentration in the collector layer, such that a graded junction is formed.

To achieve the stated and other advantages of the present invention, as embodied and described below, the invention further includes a method for making integrated circuits having at least one heterojunction bipolar transistor, comprising: forming a degeneratively doped n-type subcollector layer on the surface of a substrate, wherein the subcollector layer has a surface; forming a doped n-type collector layer on the subcollector layer, wherein the collector layer has less doping than the subcollector layer, wherein the collector layer has a surface and a central portion; implanting a pseudoalloying material at varying concentrations in the collector layer, the concentration varying from a lesser concentration in the central portion to a greater concentration at the collector layer surface; replacing a region of the collector layer having the implanted pseudoalloying material with a p-type base region, the p-type base region having a surface; and forming a doped n-type emitter layer on the surface of the p-type base region, the emitter layer having greater doping than the collector layer.

To achieve the stated and other advantages of the present invention, as embodied and described below, the invention further includes a heterojunction bipolar transistor, comprising: a semi-insulating boron-doped silicon carbide layer formed on a silicon carbide substrate, the semi-insulating boron-doped silicon carbide layer having a surface; a degeneratively doped n-type subcollector layer formed on the surface of the semi-insulating boron-doped silicon carbide layer; a doped n-type collector layer formed on the subcollector layer, wherein the collector layer has less doping than the subcollector layer, wherein the collector layer has a surface; a degeneratively doped p-type base layer formed on the surface of the collector layer, the base layer having a surface; and a doped n-type emitter layer formed on the surface of the base layer, the emitter layer having greater doping than the collector layer; wherein a pseudoalloying material is introduced at varying concentrations in the base layer and in the collector layer, the concentration varying from a greater concentration in the base layer to a lesser concentration in the collector layer, such that a graded junction is formed.

To achieve the stated and other advantages of the present invention, as embodied and described below, the invention further includes a heterojunction bipolar transistor, comprising: a doped n-type collector layer formed on the subcollector layer, wherein the collector layer has less doping than the subcollector layer, wherein the collector layer has a surface; a degeneratively doped p-type base layer formed on the surface of the collector layer, the base layer having a surface; and a doped n-type emitter layer formed on the surface of the base layer, the emitter layer having greater doping than the collector layer; wherein a pseudoalloying material is introduced at varying concentrations in the base layer and in the collector layer, the concentration varying from a greater concentration in the base layer to a lesser concentration in the collector layer, such that a graded junction is formed.

Additional advantages and novel features of the invention will be set forth in part in the description that follows, and in part will become more apparent to those skilled in the art upon examination of the following or upon learning by practice of the invention.

DETAILED DESCRIPTION

Figure 1:
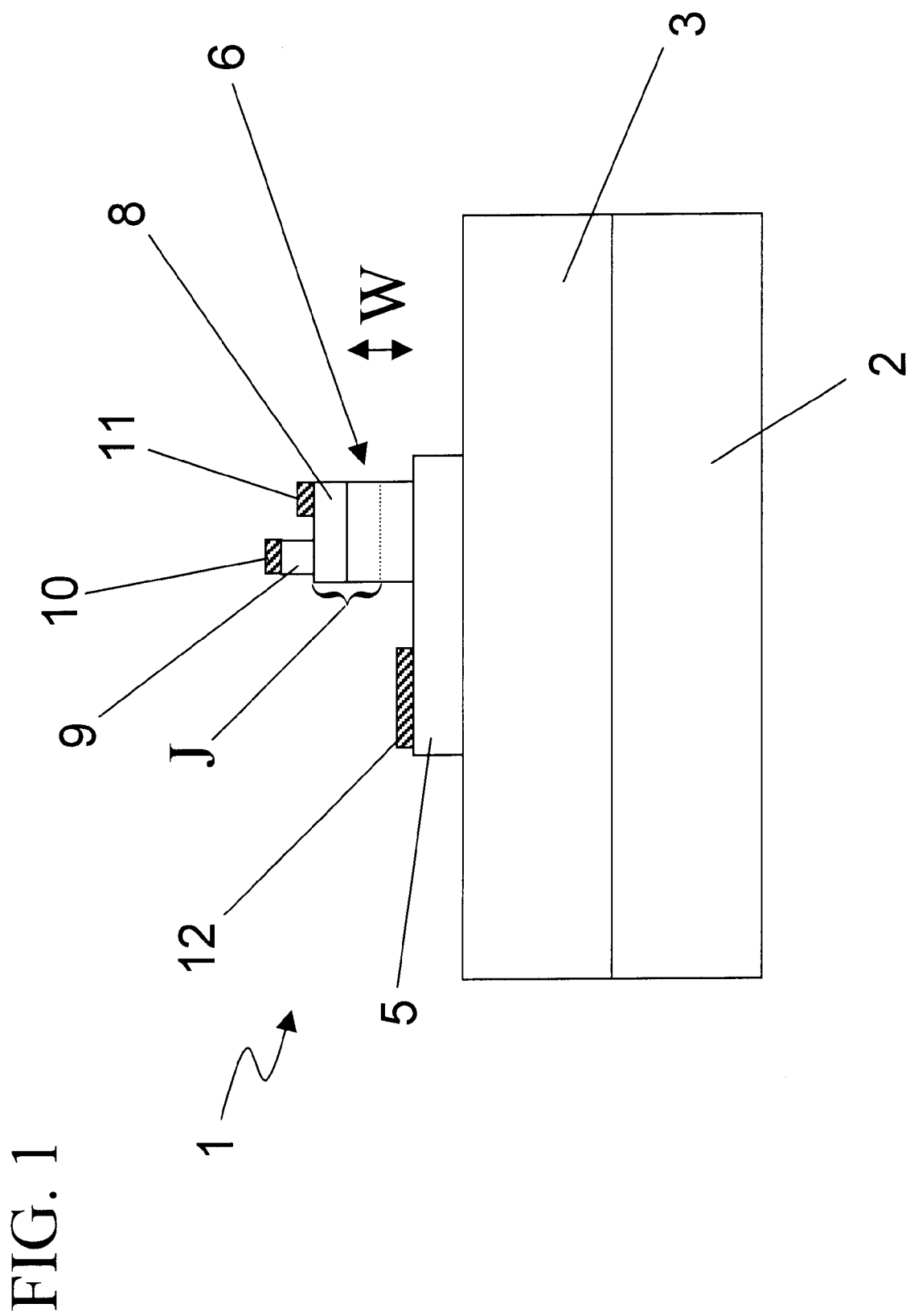
FIG. 1 shows a cross-sectional view of an all SiC heterojunction bipolar transistor (HBT), in which all device layers are grown epitaxially, and the heterojunction is created by introducing a pseudoalloying material, in accordance with an embodiment of the present invention.

The present invention includes an all SIC heterojunction bipolar transistor using germanium base doping to produce a suitable emitter/base heterojunction, a technology analogous to the highly successful narrow bandgap SiGe microwave HBT technology. A cross-sectional view of a single-finger embodiment of the present invention is shown in FIG. 1. The device of the embodiment shown in FIG. 1 is an all SiC HBT, in which all device layers are grown epitaxially, and the heterojunction is created by introducing (via, for example, implantation or chemical vapor deposition (CVD)) a pseudoalloying material, germanium, that is known to decrease the bandgap of the resulting SiC:Ge material with respect to pure SiC.

As shown in FIG. 1, a vertical HBT 1 includes a semi-insulating 4H or 6H silicon carbide substrate 2, a semi-insulating boron-doped silicon carbide epitaxial layer for device/substrate buffering 3, a degenerately nitrogen-doped n-type epilayer forming the subcollector 5, a more lightly nitrogen-doped n-type epilayer forming the collector 6 with width W, a degenerately aluminum-doped p-type epilayer 8 forming the base, and a moderately nitrogen doped n-type epilayer forming the emitter 9, and a degenerately nitrogen doped n-type epilayer forming the emitter cap for emitter ohmic contact. In one embodiment, the emitter-base heterojunction 1 is formed by implanting germanium into the p-type base 8, with a concentration peaking inside the base 8, and trailing off into the collector 6 to form a graded junction J (graded implant). The concentration of germanium is variably adjustable so as to vary performance. This process is most compatible with all epitaxial HBT 1 formation if the epitaxial film growth process for the HBT 1 is terminated before the emitter 9 is formed, the germanium implant and associated anneals is then completed, and the n-type emitter epitaxial layer 9 is then formed.

The process for use in producing the device of FIG. 1 results in an abrupt emitter-base heterojunction and a graded base-collector heterojunction, as is normally desired in HBT's to dramatically reduce base-to-emitter hole injection while providing a built-in potential from the emitter to the collector that assists the diffusion of electrons across the base neutral region and minimizes the base-collector diffusion barrier resulting from the double heterojunction. Ohmic contact is made by metalizations 10, 11, 12, as shown in FIG. 1 to the degenerately doped emitter cap, base, and subcollector, respectively.

Figure 2:
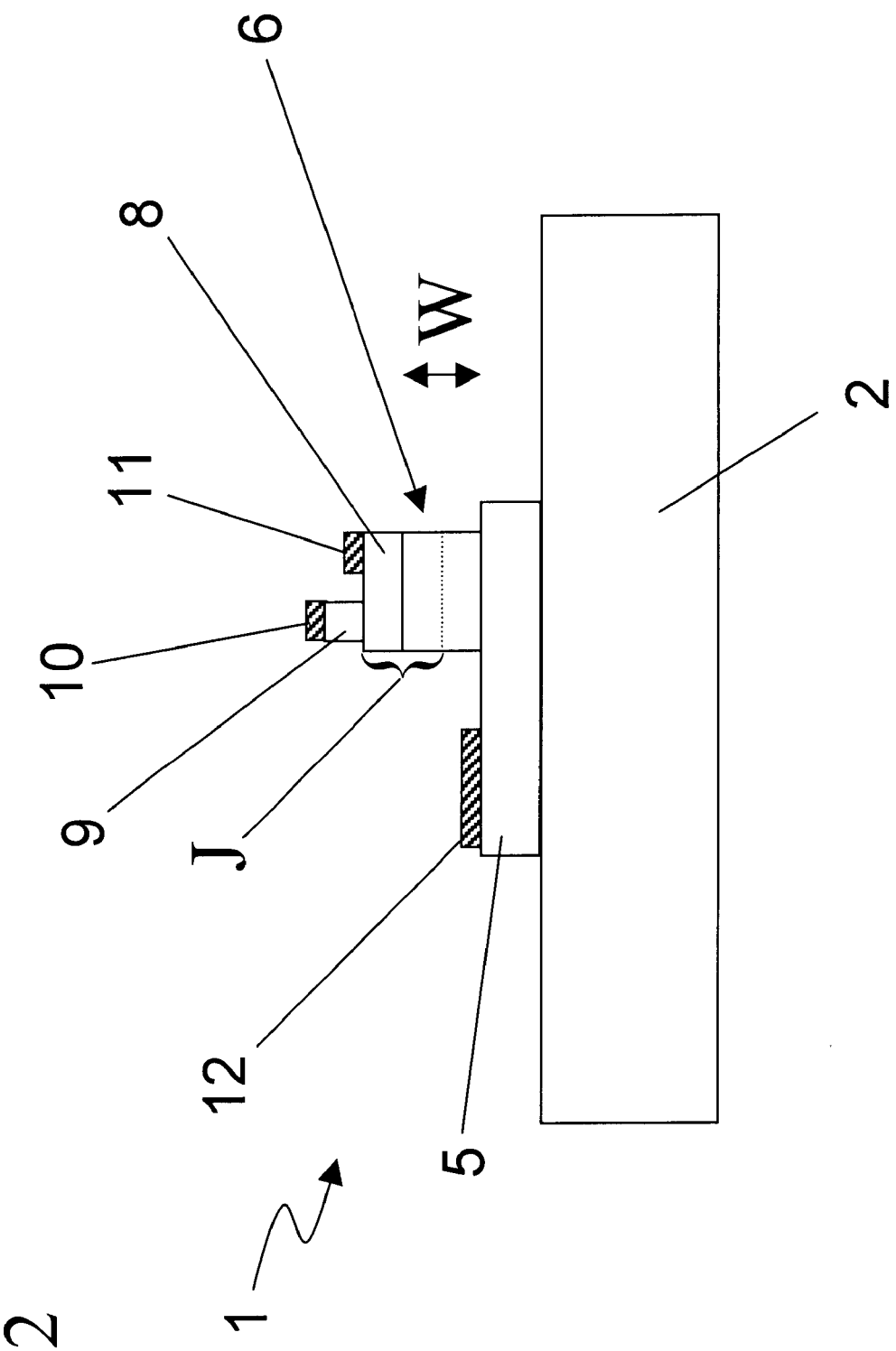
FIG. 2 presents a cross-sectional view of an SiC HBT, in which the device epitaxial layers are grown directly onto a semi-insulating substrate, in accordance with an embodiment of the present invention.

Another embodiment of the present invention includes an HBT 1, as shown in cross-section in FIG. 2. The HBT and method of forming thereof similar to that for the HBT shown in FIG. 1, in which the device epitaxial layers 5, 6, 8, 9 are grown directly onto a semi-insulating substrate 2, so that the subcollector 5 also acts as a substrate buffer.

Figure 3:
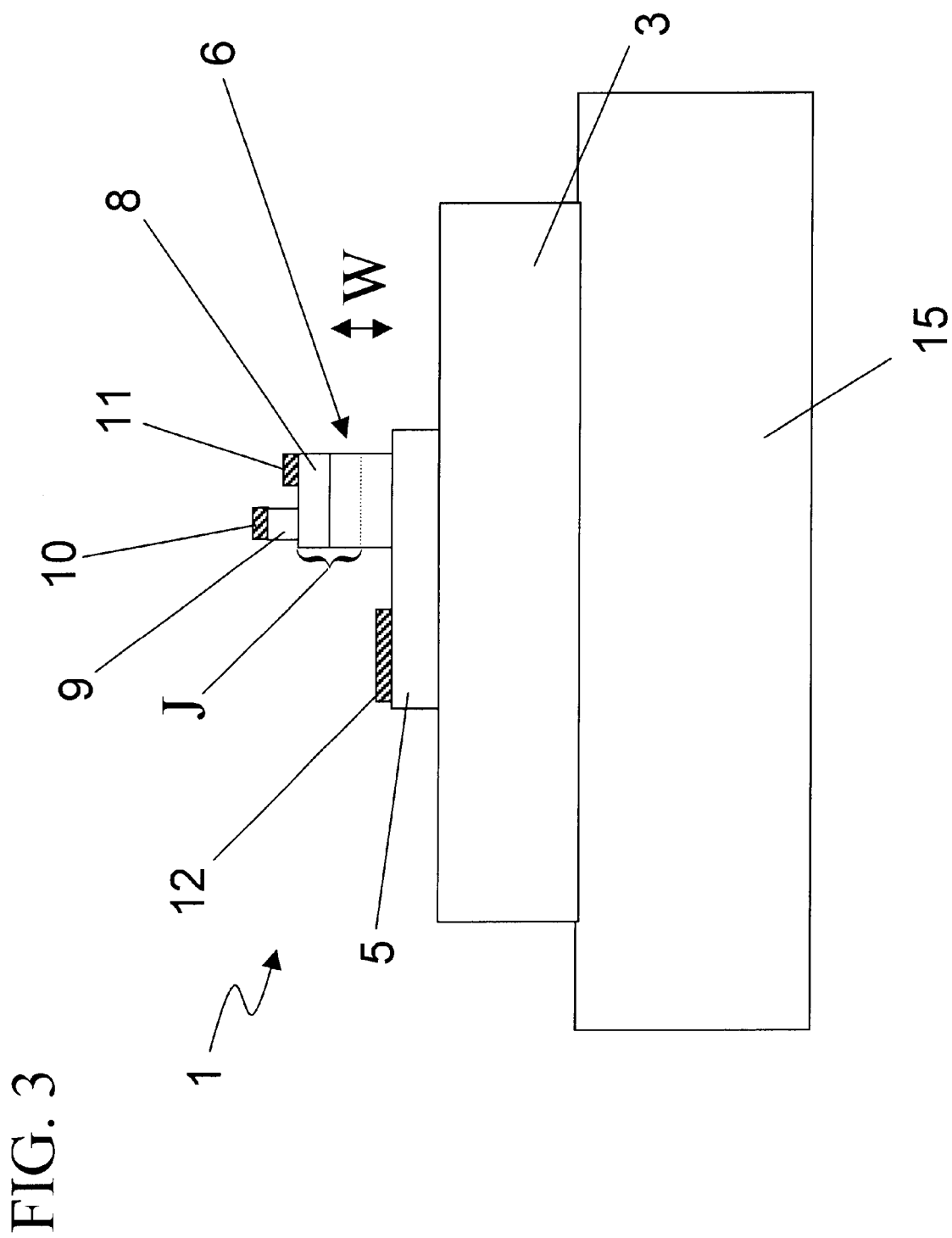
FIG. 3 is a cross-sectional view of an SiC HBT, in which the semi-insulating epitaxial layer is grown onto a conducting substrate, in accordance with an embodiment of the present invention.

Another embodiment includes an HBT 1, as shown in cross-section in FIG. 3, in which the semi-insulating epitaxial layer 3 is grown onto a conducting substrate 15.

Figure 4:
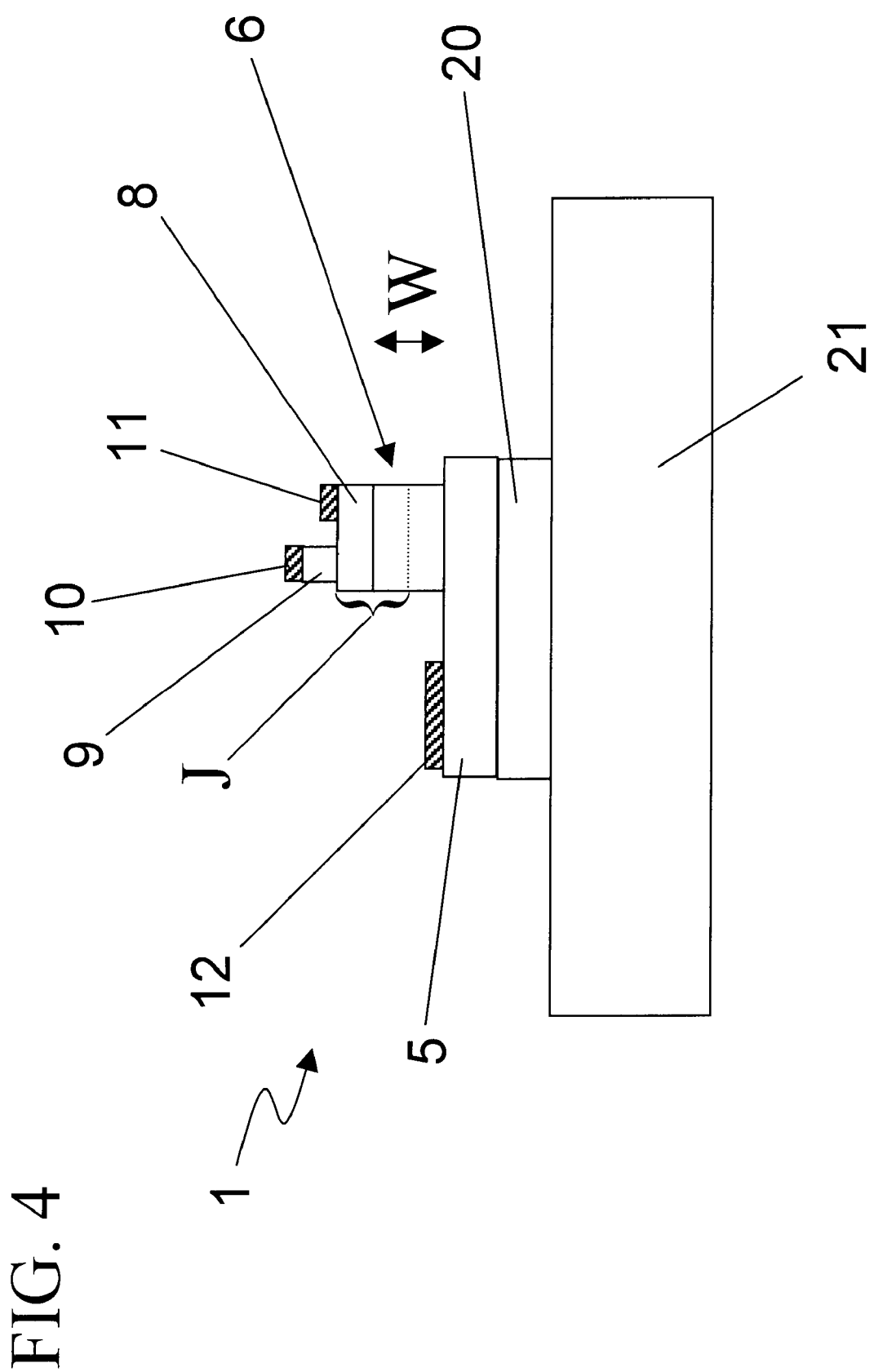
FIG. 4 shows a cross-sectional view of an SiC HBT, in which the subcollector is grown on a lightly doped p-type epitaxial layer grown on a conducting substrate for pn junction isolation.

Yet another embodiment includes an HBT 1, as shown in cross-section in FIG. 4, in which the subcollector 5 is grown on a lightly doped p-type epitaxial layer 20 grown on a conducting substrate 21 for pn junction isolation.

Figure 5:
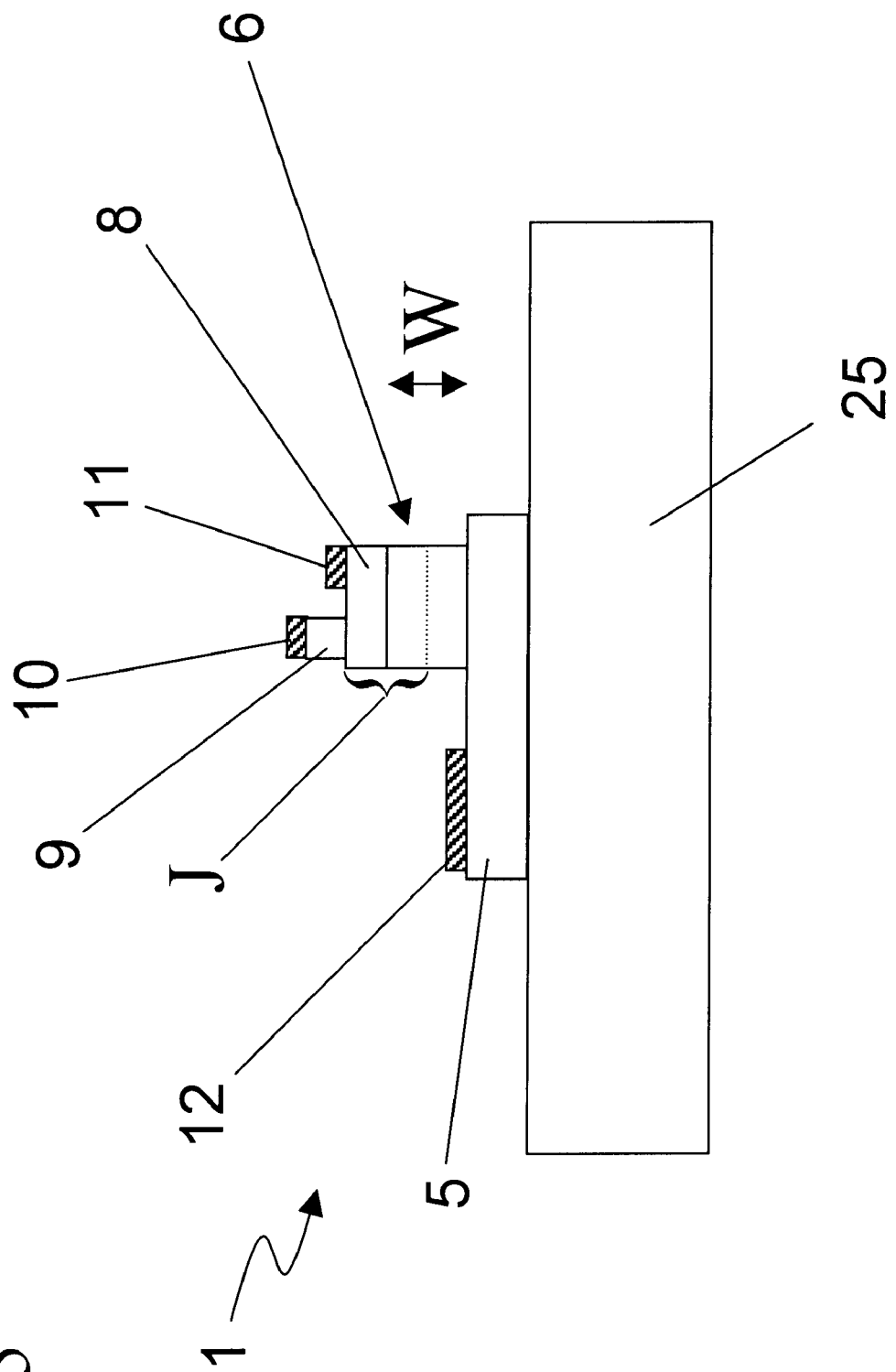
FIG. 5 presents a cross-sectional view of an SiC HBT, in which the subcollector is grown directly onto a conducting substrate, in accordance with an embodiment of the present invention.

Yet another embodiment includes an HBT 1, as shown in cross-section in FIG. 5, in which the subcollector 5 is grown directly onto a conducting substrate 25 to permit a high-power medium-frequency vertical device 1 that conducts through the substrate 25 to a bottom contact.

Figure 6:
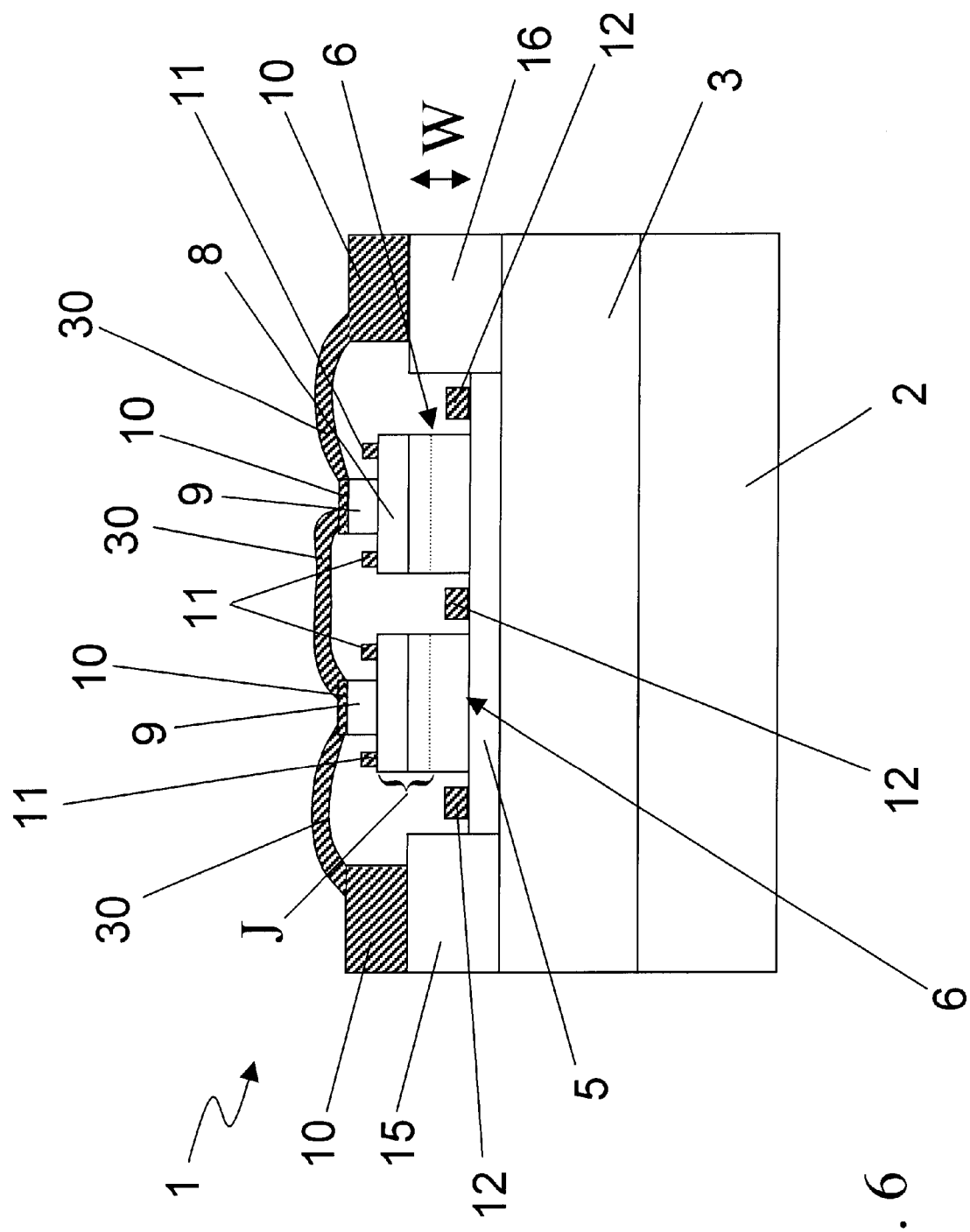
FIG. 6 is a cross-sectional view of an all SiC HBT, particularly for use in high performance applications, in which additional emitter fingers are connected by metalization air bridges spanning over the base fingers and the collector fingers, in accordance with an embodiment of the present invention.

Yet another embodiment of the invention is a multi-finger HBT 1 particularly for use in high power applications. As shown in cross-section in FIG. 6, emitter fingers 10 are connected by metalizations 30, referred to as air bridges, spanning among emitter layers 9 and to insulator materials 15, 16 over the base fingers 11 and the collector fingers 12. Some emitter fingers 10 are grown or otherwise formed on insulator portions 15, 16, such as an oxide (e.g., silicon dioxide) or other dielectric material. As shown in FIG. 6, the HBT 1 includes the subcollector 5 and the collectors 6.

In one embodiment, the air bridges 30 are formed on the surface of photoresist material, which is then dissolved or otherwise removed, leaving the metalization air bridges 30. Use of air instead of a dielectric material to support the air bridges 30 reduces capacitance between the metalizations 9 and metalizations 11, 12. Capacitance between terminals slows performance in high frequency applications, and use of air bridges 30, with minimized capacitance, thus minimizes any negative impact on performance.

Figure 7:
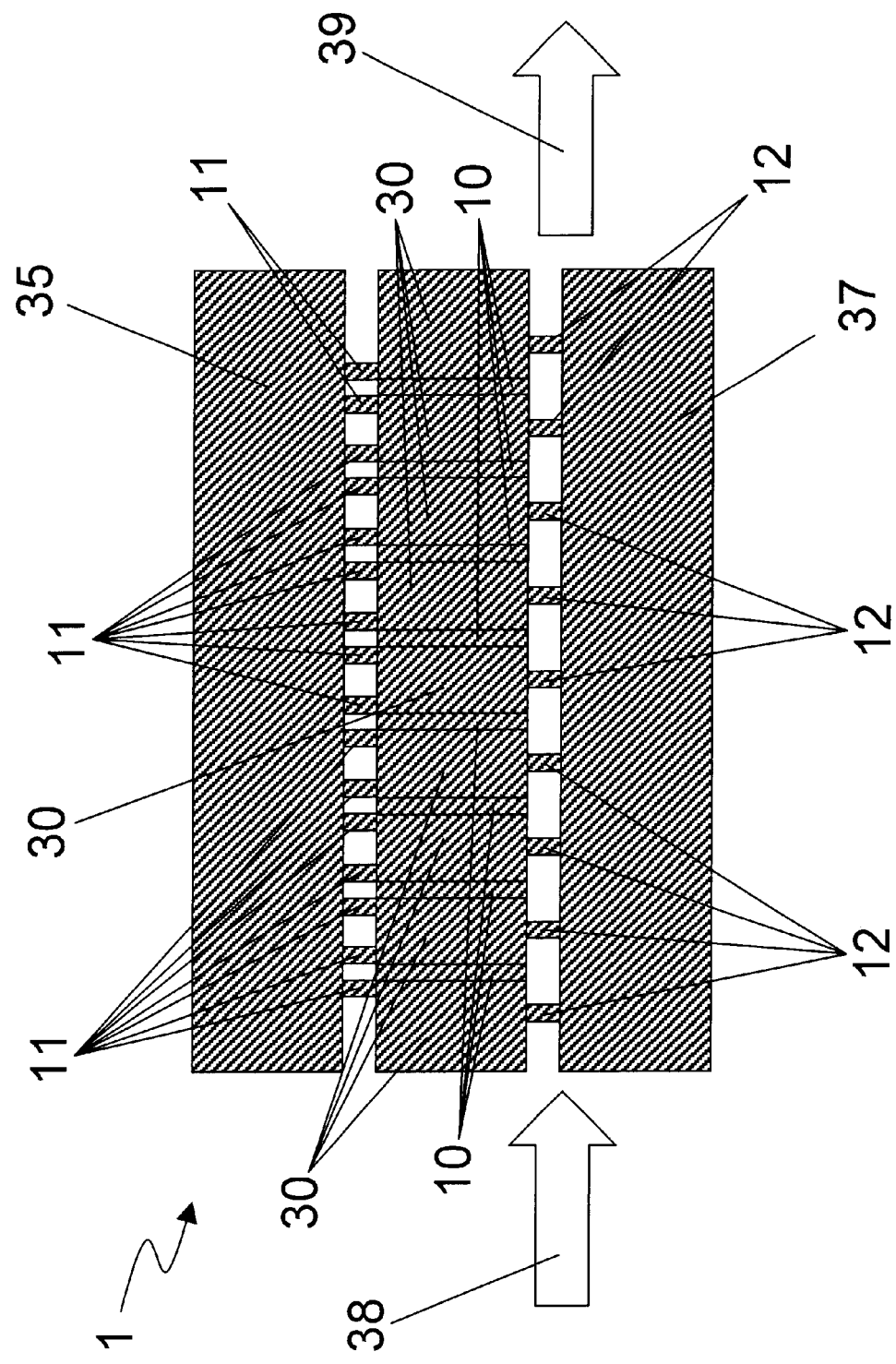
FIG. 7 shows an overhead view of the HBT of FIG. 6.

FIG. 7 shows an overhead view of the HBT 1 of FIG. 6. As shown in FIG. 7, air bridges 30 span between metalizations 10 and above base fingers 11 and collector fingers 12. Conducting contact 35 is formed so as to be connected to base fingers 11, and conducting contact 37 is formed for connection to collector fingers 12. As further representatively shown in FIG. 7, power 38 is transmitted to HBT 1, and output power 39 is then transmitted to, for example, a power amplifier, such as for use with coplaner waveguides.

Yet another embodiment is an HBT 1, similar to the HBT shown in FIGS. 1 and FIG. 6, in which all or some of the epitaxial layers 5, 6, 8, 9 or are grown with dopants other than nitrogen or aluminum to produce the specified carrier types in the epitaxial layers (i.e., n-type or p-type).

Figure 8:
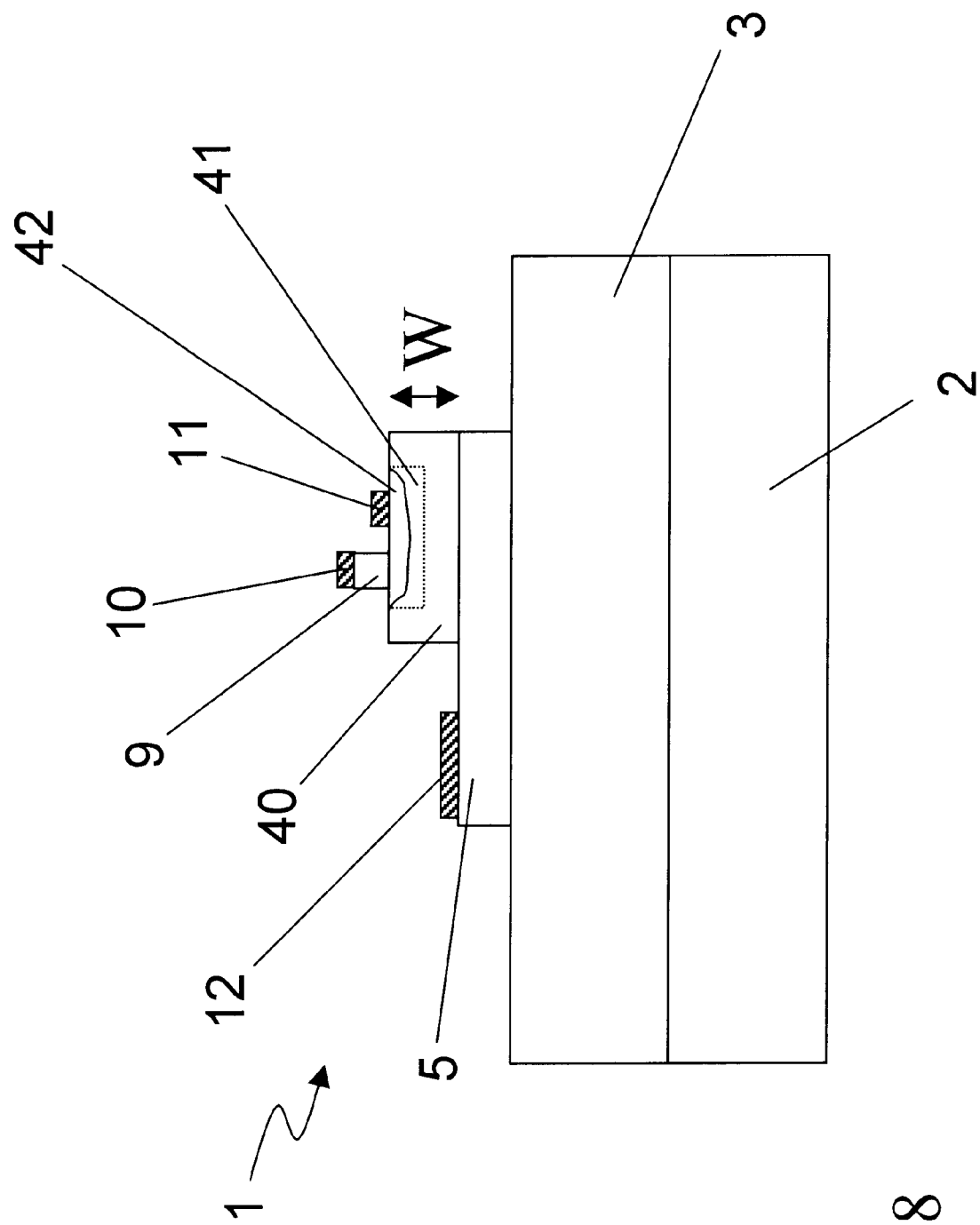
FIG. 8 presents a cross-sectional view of an SiC HBT, in which some or all of the epitaxial layers are replaced by regions implanted with n-type and p-type dopants prior to or concurrently with germanium implantation to make the heterojunction, in accordance with an embodiment of the present invention.

Yet another embodiment is an HBT 1, as shown in cross-section in FIG. 8, in which some or all of the epitaxial layers are replaced by regions implanted with n-type and p-type dopants (e.g., nitrogen and aluminum or boron, respectively) prior to or concurrently with germanium implantation to make the heterojunction, thus making for more planar devices with thinner more tightly controlled base thicknesses for higher $f_T$, and maximum frequency. As shown in FIG. 8, the epitaxial layer 40, such as an n-type region, includes a graded implant portion 41, such as 4H SiC:Ge, and, within the graded implant portion 41, an implanted portion 42, the implanted portion 42 being, for example, of a doped p-type.

Example embodiments of the present invention have now been described in accordance with the above advantages. It will be appreciated that these examples are merely illustrative of the invention. Many variations and modifications will be apparent to those skilled in the art.

What is claimed is:

1. A method for making integrated circuits having at least one heterojunction bipolar transistor, comprising:
   forming a semi-insulating boron-doped silicon carbide layer on a silicon carbide substrate, the semi-insulating boron-doped silicon carbide layer having a surface;
   forming a degeneratively doped n-type subcollector layer on the surface of the semi-insulating boron-doped silicon carbide layer;
   forming a doped n-type collector layer on the subcollector layer, wherein the collector layer has less doping than the subcollector layer, wherein the collector layer has a surface;
   forming a degeneratively doped p-type base layer on the surface of the collector layer, the base layer having a surface; and
   forming a doped n-type emitter layer on the surface of the base layer, the emitter layer having greater doping than the collector layer;
   wherein a pseudoalloying material is introduced at varying concentrations in the base layer and in the collector layer, the concentration varying from a greater concentration in the base layer to a lesser concentration in the collector layer, such that a graded junction is formed.

2. The method of claim 1, wherein the pseudoalloying material is germanium.

3. The method of claim 1, wherein the pseudoalloying material is introduced in the base layer and in the collector layer via implantation.

4. The method of claim 1, wherein the pseudoalloying material is introduced in the base layer and in the collector layer via chemical vapor deposition.

5. The method of claim 1, wherein the silicon carbide substrate comprises a semi-insulating 4H silicon carbide substrate.

6. The method of claim 1, wherein the silicon carbide substrate comprises a semi-insulating 6H silicon carbide substrate.

7. The method of claim 1, wherein each of the layers is formed via epitaxial growth.

8. The method of claim 1, wherein forming the semi-insulating boron-doped silicon carbide layer, forming the subcollector layer, forming the collector layer, and forming the base layer occur via a first continuous epitaxial growth; wherein the first continuous epitaxial growth is then terminated; wherein following termination of the first continuous epitaxial growth, the pseudoalloying material is introduced at varying concentrations in the base layer and the collector layer; and wherein following introduction of the pseudoalloying material, the emitter layer is formed by a second continuous epitaxial growth.

9. The method of claim 8, wherein the pseudoalloying material is introduced via implantation and annealing.

10. The method of claim 9, wherein the pseudoalloying material is germanium.

11. The method of claim 1, wherein each of the n-type doped layers are doped with nitrogen.

12. The method of claim 1, wherein the base layer is doped with aluminum.

13. The method of claim 1, wherein each of the n-type doped layers are doped with nitrogen and aluminum.

14. The method of claim 1, further comprising:
   attaching a collector electrode to the surface of the subcollector layer, such that the collector electrode is in electrical contact with the subcollector layer.

15. The method of claim 1, further comprising:
   attaching a base electrode to the surface of the base layer, such that the base electrode is in electrical contact with the base layer.

16. The method of claim 1, further comprising:
   attaching an emitter electrode to the surface of the emitter layer, such that the emitter electrode is in electrical contact with the emitter layer.

17. A method for making integrated circuits having at least one heterojunction bipolar transistor, comprising:
   forming a degeneratively doped n-type subcollector layer on a substrate;
   forming a doped n-type collector layer on the subcollector layer, wherein the collector layer has less doping than the subcollector layer, wherein the collector layer has a surface;
   forming a degeneratively doped p-type base layer on the surface of the collector layer, the base layer having a surface; and
   forming a doped n-type emitter layer on the surface of the base layer, the emitter layer having greater doping than the collector layer;
   wherein a pseudoalloying material is introduced at varying concentrations in the base layer and in the collector layer, the concentration varying from a greater concentration in the base layer to a lesser concentration in the collector layer, such that a graded junction is formed.

18. The method of claim 17, wherein the substrate comprises silicon carbide.

19. The method of claim 17, wherein the substrate is a conductor.

20. The method of claim 19, wherein forming a degeneratively doped n-type subcollector layer on a substrate further comprises:
   forming a doped p-type layer on the substrate, the doped p-type layer having a surface; and
   forming the degeneratively doped n-type layer on the surface of the doped p-type layer.

21. The method of claim 20, wherein the p-type layer is lightly doped.

22. The method of claim 17, wherein forming a degeneratively doped n-type subcollector layer on a substrate further comprises:
   forming a semi-insulating boron-doped silicon carbide layer on a conducting substrate, the semi-insulating boron-doped silicon carbide layer having a surface; and
   forming a degeneratively doped n-type subcollector layer on the surface of the semi-insulating boron-doped silicon carbide layer.

23. A method for making integrated circuits having at least one heterojunction bipolar transistor, comprising:
   forming a degeneratively doped n-type subcollector layer on the surface of a substrate, wherein the subcollector layer has a surface and at least one edge, and wherein the subcollector is bounded on at least one edge by an insulator, the insulator having a surface;
   forming at least one doped n-type collector layer on the subcollector layer, wherein each of the at least one collector layer has less doping than the subcollector layer, wherein the collector layer has a surface;
   forming a degeneratively doped p-type base layer on the surface of each of the at least one collector layer, such that at least one base layer is formed, each of the at least one base layer having a surface;

forming a doped n-type emitter layer on the surface of each of the at least one base layer, such that at least one emitter layer is formed, each of the at least one emitter layer having greater doping than each of the at least one collector layer, and wherein each of the at least one emitter layer has a surface; and forming at least one conducting bridge between the surface of at least one of the at least one emitter layer and the surface of the insulator;

wherein a pseudoalloying material is introduced at varying concentrations in the base layer and in the collector layer, the concentration varying from a greater concentration in the base layer to a lesser concentration in the collector layer, such that a graded junction is formed.

24. The method of claim 23, wherein forming a degeneratively doped n-type subcollector layer on the surface of a substrate further comprises:

forming a semi-insulating boron-doped silicon carbide layer on a silicon carbide substrate, the semi-insulating boron-doped silicon carbide layer having a surface; and forming a degeneratively doped n-type subcollector layer on the surface of the semi-insulating boron-doped silicon carbide layer.

25. The method of claim 23, wherein the insulator is an oxide.

26. The method of claim 25, wherein the oxide is silicon dioxide.

27. A method for making integrated circuits having at least one heterojunction bipolar transistor, comprising:

forming a degeneratively doped n-type subcollector layer on the surface of a substrate, wherein the subcollector layer has a surface;

forming a doped n-type collector layer on the subcollector layer, wherein the collector layer has less doping than the subcollector layer, wherein the collector layer has a surface and a central portion;

implanting a pseudoalloying material at varying concentrations in the collector layer, the concentration varying from a lesser concentration in the central portion to a greater concentration at the collector layer surface;

replacing a region of the collector layer having the implanted pseudoalloying material with a p-type base region, the p-type base region having a surface; and forming a doped n-type emitter layer on the surface of the p-type base region, the emitter layer having greater doping than the collector layer.

\* \* \* \* \*

UNITED STATES PATENT AND TRADEMARK OFFICE
CERTIFICATE OF CORRECTION

PATENT NO. : 6,410,396 B1
DATED : June 25, 2002
INVENTOR(S) : Jeffrey B. Casady et al.

It is certified that error appears in the above-identified patent and that said Letters Patent is hereby corrected as shown below:

<u>Title page,</u>
Item [56], before the References Cited section, please insert the following:

-- This invention was made with U.S. Government support under Contract Number N00014-99-1-1103 awarded by the Office of Naval Research. The U.S. Government may have certain rights in this invention. --

Signed and Sealed this

Twenty-ninth Day of April, 2003

JAMES E. ROGAN
*Director of the United States Patent and Trademark Office*